United States Patent
Rimoldi et al.

(10) Patent No.: US 7,155,375 B1
(45) Date of Patent: Dec. 26, 2006

(54) METHOD AND SYSTEM FOR DESIGNING OBJECTS USING DESIGN INTENT MERGE

(75) Inventors: Attilio Rimoldi, Cupertino, CA (US); Gian Paolo Bassi, San Jose, CA (US)

(73) Assignee: ImpactXoft, San Jose, CA (US)

( * ) Notice: Subject to any disclaimer, the term of this patent is extended or adjusted under 35 U.S.C. 154(b) by 933 days.

(21) Appl. No.: 10/071,466

(22) Filed: Feb. 8, 2002

Related U.S. Application Data

(60) Provisional application No. 60/323,215, filed on Sep. 17, 2001.

(51) Int. Cl.
*G06F 17/10* (2006.01)
*G06F 9/455* (2006.01)

(52) U.S. Cl. .............. 703/2; 703/7; 703/1; 703/27; 700/98; 700/193; 345/419; 345/781

(58) Field of Classification Search .............. 703/2, 703/1, 27, 7; 700/98, 193; 345/419, 781, 345/420; 717/105
See application file for complete search history.

(56) References Cited

U.S. PATENT DOCUMENTS

| | | | |
|---|---|---|---|
| 5,815,154 A | | 9/1998 | Hirschtick et al. |
| 5,995,097 A | | 11/1999 | Tokumine et al. |
| 6,219,055 B1 | | 4/2001 | Bhargava et al. |
| 6,360,357 B1 | | 3/2002 | Cesare |
| 6,462,751 B1 | | 10/2002 | Felser et al. |
| 6,604,068 B1 | | 8/2003 | Bukowski et al. |
| 6,628,279 B1 | | 9/2003 | Schell et al. |
| 6,629,065 B1 * | | 9/2003 | Gadh et al. .............. 703/1 |
| 6,681,145 B1 * | | 1/2004 | Greenwood et al. ........ 700/193 |
| 6,686,914 B1 * | | 2/2004 | Keener ................... 345/420 |
| 6,828,963 B1 * | | 12/2004 | Rappoport ............... 345/419 |
| 6,868,297 B1 * | | 3/2005 | Rimoldi et al. ............. 700/98 |
| 6,952,660 B1 * | | 10/2005 | Matheson ................ 703/1 |
| 6,985,835 B1 * | | 1/2006 | Etzion et al. .............. 703/1 |
| 2001/0043236 A1 * | | 11/2001 | Yamamoto .............. 345/781 |
| 2002/0012007 A1 | | 1/2002 | Twigg |
| 2002/0035450 A1 * | | 3/2002 | Thackston ............... 703/1 |
| 2002/0083398 A1 * | | 6/2002 | Takeyama et al. ......... 716/1 |
| 2002/0107673 A1 * | | 8/2002 | Haller et al. ............. 703/1 |
| 2002/0123812 A1 * | | 9/2002 | Jayaram et al. ........... 700/98 |
| 2002/0183878 A1 * | | 12/2002 | Chartier et al. ........... 700/98 |
| 2003/0176994 A1 * | | 9/2003 | Spitz et al. .............. 703/27 |
| 2004/0128648 A1 * | | 7/2004 | Rappoport et al. ......... 717/105 |

OTHER PUBLICATIONS

Chung et al., "Extended variational design technology—foundation for integrated design automation", ACM 1999.*
Shih et al., "A design/constraint model to capture design intent", ACM 1997.*

(Continued)

*Primary Examiner*—Kandasamy Thangavelu
(74) *Attorney, Agent, or Firm*—Blakely, Sokoloff, Taylor & Zafman

(57) ABSTRACT

A method and apparatus for merging design intent of multiple designers with respect to a digital model of an object are described. In one embodiment, the method includes receiving data concerning a change to the digital model performed by a fist designer. The method further includes analyzing the data concerning the change performed by the first designer and data concerning a digital model version created by a second designer, and integrating the change performed by the first designer into the digital model version created by the second designer.

34 Claims, 18 Drawing Sheets

OTHER PUBLICATIONS

Greco, J., "The CAD Collaboration Trails," Computer Graphics World-graphics, 3d modeling, and visual computing, 2002, 8 pages, http://cgw.pennwellnet.com/Articles/Article_Display.cfm?Section=Archives&Subsection=Display&ARTICLE_ID=108469&KEYWORD=%22CAD%20Collaboration%22.

Stevens, T., Technologies of the Year—IX SpeeD For Simultaneous Product Development, IndustryWeek.com, Made2Manage Systems, Dec. 1, 2001, 3 pages, http://www.industryweek.com/CurrentArticles/asp/articles.asp?ArticleID=1164.

* cited by examiner

SWEEP PRIMITIVES (SHELLABLE)

CUTOUT WITHOUT THICKNESS

CUTOUT WITH THICKNESS

RIB

BOSS

BOSS WITH THICKNESS

POCKET "PROTECTED" (i.e., NO VOLUME INSIDE IS ALLOWED)

POCKET "NOT PROTECTED" (i.e., INSIDE VOLUMES ARE ALLOWED)

POCKET-KEEP SURFACE BOTTOM

PULL

REINFORCEMENT

JOIN

METHOD AND SYSTEM FOR DESIGNING OBJECTS USING DESIGN INTENT MERGE

RELATED APPLICATIONS

This application claims the benefit of U.S. Provisional Application No. 60/323,215, filed Sep. 17, 2001.

FIELD OF THE INVENTION

The present invention relates to the field of computer-aided design (CAD) of physical parts and assemblies; more particularly, the present invention relates to designing objects using design intent merge.

BACKGROUND

A typical computer-aided design (CAD) system employed in engineering contexts uses a geometry-oriented approach to define and represent engineering information. As a result, a designer is required to perform a number of low-level geometric operations in order to produce a final digital model of a desired product. In other words, the designer has to focus on the details of geometry creation rather than the required functionality of the product.

In addition, conventional CAD systems use a rigid history-based modeling approach that creates dependency between the operations performed by the designer when creating a digital model. That is, an earlier operation may influence subsequent operations or, alternatively, a subsequent operation may obliterate the functionality of a prior operation. This order dependent nature of feature operations makes it difficult for the designer to apply any modification to the digital model or correct mistakes occurred early in the design process.

Further, conventional CAD systems do not allow members of a product development team to work together simultaneously, regardless of their location or role, in order to create and finalize product definitions. Instead, current design intent collaborative practices are based on serial collaboration, in which copies of digital product files are passed back and forth among development team members who must wait to get these copies back before they can make or even suggest design refinements.

SUMMARY OF THE INVENTION

A method and apparatus for merging design intent of multiple designers with respect to a digital model of an object are described. According to one aspect of the present invention, the method includes receiving data concerning a change to the digital model performed by a fist designer. The method further includes analyzing the data concerning the change performed by the first designer and data concerning a digital model version created by a second designer, and integrating the change performed by the first designer into the digital model version created by the second designer.

Other features of the present invention will be apparent from the accompanying drawings and from the detailed description that follows.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
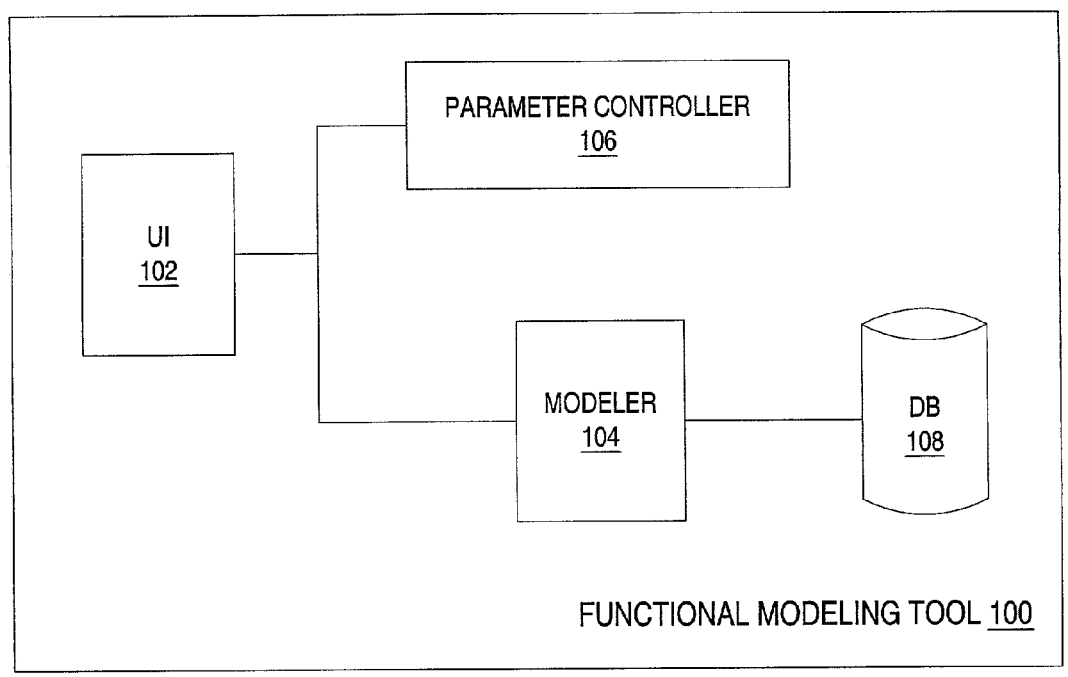
FIG. 1 is a block diagram of one embodiment of a tool for designing objects using functional modeling.

A method and system for designing objects using design intent merge are described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

A mechanism for designing objects using functional modeling is described. Unlike conventional designing tools that require designers to focus on low level geometric details, functional modeling allows the designers to concentrate on behavioral parameters of design elements. Behavioral parameters define the required engineering functionality of design elements.

In one embodiment, a user creating a digital model of an object is provided with a tool that allows the user to choose a design element (also referred to herein as a design feature) needed for this object. For example, the user may choose a pocket, a cutout, a rib, a boss, a box, a cylinder, etc. The set of design features offered for the user's selection may vary depending on the industry for which the object is to be used. Further, for each design feature, the user is provided with one or more behavioral parameters that define the functionality of the design feature. For example, for a pocket, a behavioral parameter may define the thickness of the pocket's walls. In one embodiment, behavioral parameters of design features are defined based on the rules and logic of a specific application in which these design features are to be used.

The user can select some specific behavioral parameters that reflect the functionality intended by the user for this design feature. In one embodiment, behavioral parameters specified by the user also define the relations between this design feature and other design elements associated with the object. For example, the user creating a hole in the existing body of the object may specify that the wall thickness of the hole should be the same as the body thickness, thus requesting that the wall thickness of the hole be modified whenever the body thickness is changed.

Based on the behavioral parameters, the design feature is automatically modeled. That is, the geometry of the design feature is calculated and generated without further involvement of the user. In one embodiment, the user may also select some geometric parameters (e.g., a diameter of a hole) for the design feature. These geometric parameters are also utilized when generating the geometry of the design feature.

In one embodiment, the modeling is performed using a functional object representation (FOR) approach. Specifically, the body of an object being modeled is presented as a predefined set of body partitions. Each body partition is associated with a certain volume type. These volume types may include, for example, a volume representing a core of the object, a volume representing a cavity inside the object, a volume added outside of the core, a volume added across the core, a volume representing a clearance area within the object (e.g., a cutout), etc.

When the user selects a certain combination of behavioral parameters for a design feature, this combination is analyzed to determine which body partitions correspond to the design feature. The corresponding body partitions are then assigned volumes created by the design feature. These operations are performed for each design feature associated with the object. As a result, depending on a particular design, some body partitions may have volumes contributed by one or more design features while others may have no contributing volumes.

In one embodiment, for each digital model, a predefined set of body partitions is stored in a database with corresponding contributing volumes. Each body partition that has a contributing volume may also store a link to a design feature that has created this contributing volume. This link provides access to data pertaining to this design feature, including behavioral and geometrical parameters of the design feature. Accordingly, for every digital model, the database stores a set of data that encapsulates the behavioral properties of each design feature associated with the object.

Further, the contributing volumes of each design feature associated with the object are utilized to compute the digital model of the object. In one embodiment, a constant algorithm is used for the computation. That is, the algorithm may be defined and used for all objects in any industry or, alternatively, for all objects in a specific industry or application. In one embodiment, the digital model of the object can be re-computed at any time using the set of data stored in the database.

Accordingly, functional modeling abstracts the design features from their geometrical representation and allows the user to focus on high-level functional elements and operations, rather than the creation of the detailed geometry. In addition, by maintaining a set of data that encapsulates the behavioral properties of each design feature associated with the object during the design process, a history-independent modeling approach is provided, in which each design feature retains its functionality throughout the design process, regardless of any subsequent or prior modeling operations related to the object. Furthermore, functional modeling automatically infers and maintains the relationships between the design features of the digital model during the entire design process.

Functional modeling can also be used to allow simultaneous development of an object by several designers. That is, once a first designer makes a change to a digital model, the first designer can submit a request to communicate this change to a second designer. In one embodiment, this request causes a design tool operated by the first designer to extract data pertaining to the change from the database and send it to a server which forwards this data to a client device of the second designer.

Once a design tool residing on the client device of the second designer receives the data pertaining to the change, it analyzes this data, together with data pertaining to a digital version model created by the second designer, and integrates the change performed by the first designer into the digital model version created by the second designer. The same process can also be performed if the second designer modifies the digital model and decides to communicate this modification to the first designer. This process can be performed for any number of designers participating in simultaneous object development. As a result, multiple participants in object development can work in parallel, regardless of their location and role, to create and finalize object definitions.

Functional Modeling

FIG. 1 is a block diagram of one embodiment of a tool 100 for designing objects using functional modeling. Referring to FIG. 1, functional modeling tool 100 includes a parameter controller 106, a user interface 102, a modeler 104 and a database 108. Parameter controller 106 maintains behavioral parameters for various design features. The design features may include a pocket, a cutout, a rib, a boss, a box, a hole, etc. The behavioral parameters define the functionality of design features. For example, a behavioral parameter may pertain to the shellability of a box or the thickness of a pocket's wall. In one embodiment, behavioral parameters of design features are defined based on the rules and logic of a specific application in which these design features are used.

User interface 102 displays a set of features to the user and further displays a list of behavioral parameters for a feature selected by the user. The user can then select one or more behavioral parameters from the list according to the functionality intended by the user for this design feature. In one embodiment, the user may also select some geometric parameters (e.g., a diameter of a hole) for the design feature. In one embodiment, behavioral parameters specified by the user not only define the functionality of the design feature itself but also the relations between this design feature and other design elements associated with the object. In one embodiment, the behavioral parameters specified by the user as well as other data pertaining to the design feature are stored in database 108.

Modeler 104 is responsible for modeling design feature upon receiving data pertaining to the user's selection of behavioral parameters (and geometric parameters when specified by the user). That is, modeling algorithm 104 calculates and generates the geometry of the design feature without user involvement. The calculation is performed using the behavioral parameters specified by the user. In one embodiment, the calculation is performed using a constant algorithm as will be described in more detail below.

In one embodiment, the user is allowed to modify the parameters of the design feature at any time during the design process. If the parameters being modified are geometric, the new geometry of the design feature retains the functionality that was intended by the user initially. Alternatively, if the user requests to modify any behavioral parameter of the design feature, the new geometry of the design feature will reflect the change to the feature's functionality.

In one embodiment, a change of one design feature may result in an automatic change of another design feature to maintain the intended functionality of the other design feature.

Accordingly, the design features created by modeling algorithm 104 are not affected by any previous or subsequent modeling operations unless specifically intended by the user. These design features may be associated into semantically complete clusters that can be used in different contexts.

Figure 2:
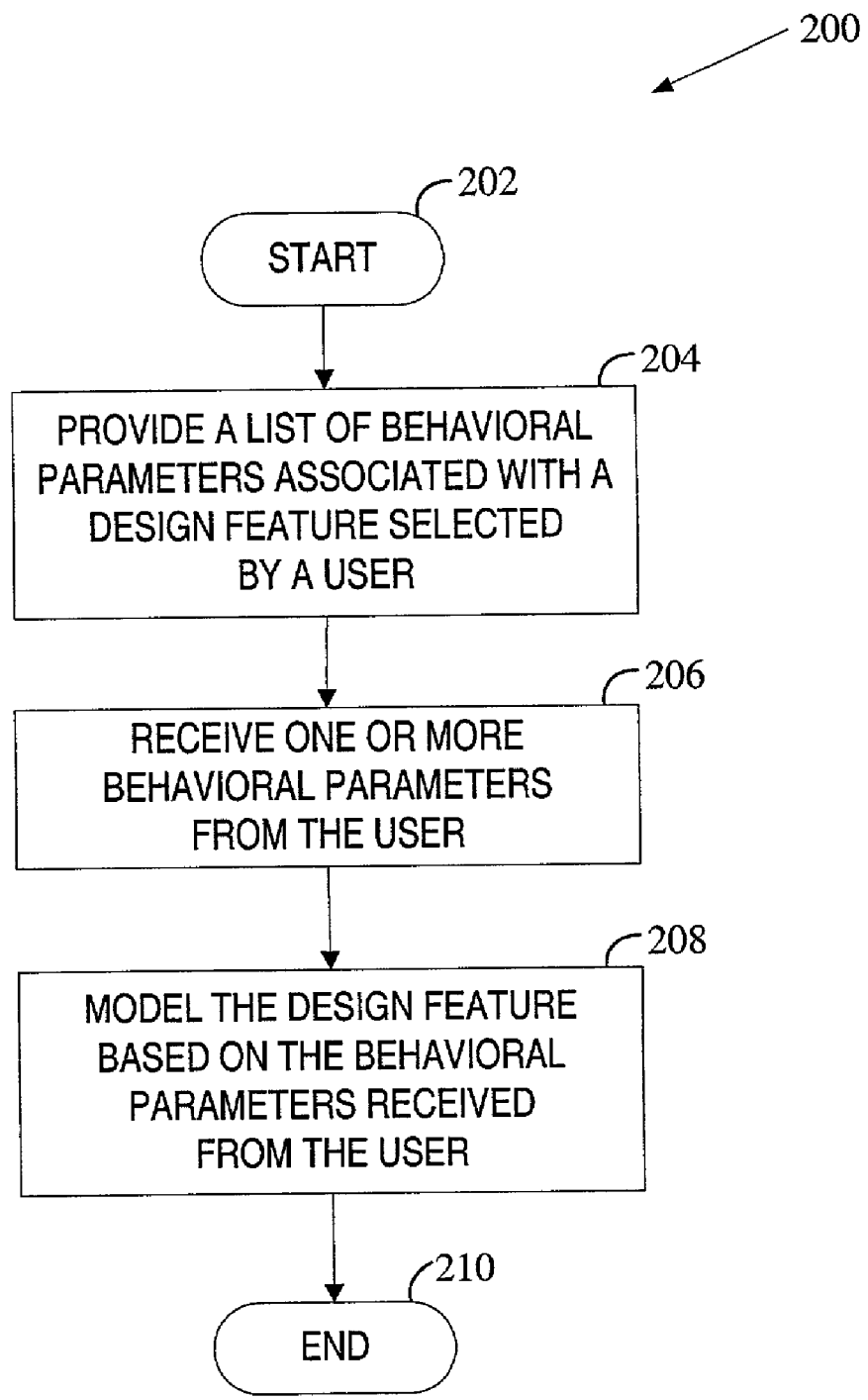
FIG. 2 is a flow diagram of one embodiment of a process for designing objects using functional modeling.

FIG. 2 is a flow diagram of one embodiment of a process 200 for designing objects using functional modeling. The process may be performed by processing logic that may comprise hardware (e.g., circuitry, dedicated logic, etc.), software (such as run on a general purpose computer system or a dedicated machine), or a combination of both.

Referring to FIG. 2, process 200 begins with processing logic providing a set of behavioral parameters associated with a design feature selected by a user (processing block 204). In one embodiment, a user interface is provided to display the set of behavioral parameters and facilitate the user's selection of these behavioral parameters as will be described in more detail below in conjunction with FIGS. 3 and 4.

At processing block 206, processing logic receives one or more behavioral parameters specified the user. In one embodiment, processing logic also receives some geometric parameters specified by the user.

At processing block 208, processing logic models the design feature based on the behavioral parameters specified by the user. In one embodiment, the modeling is performed using a functional object representation approach as will be described in greater detail below.

Figure 3:
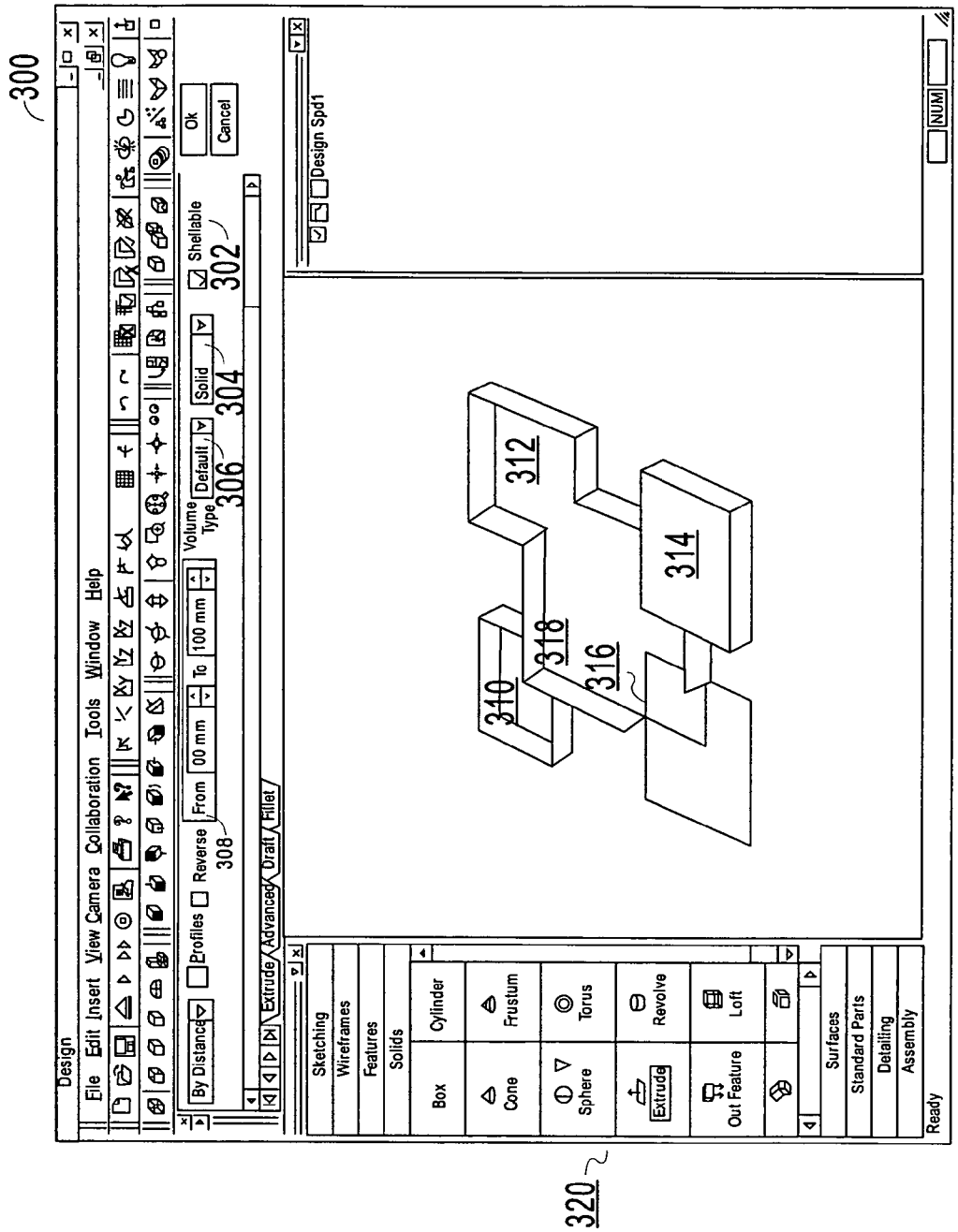
FIGS. 3 and 4 illustrate examples of user interfaces that can be used in one embodiment of the functional modeling process.
Figure 4:
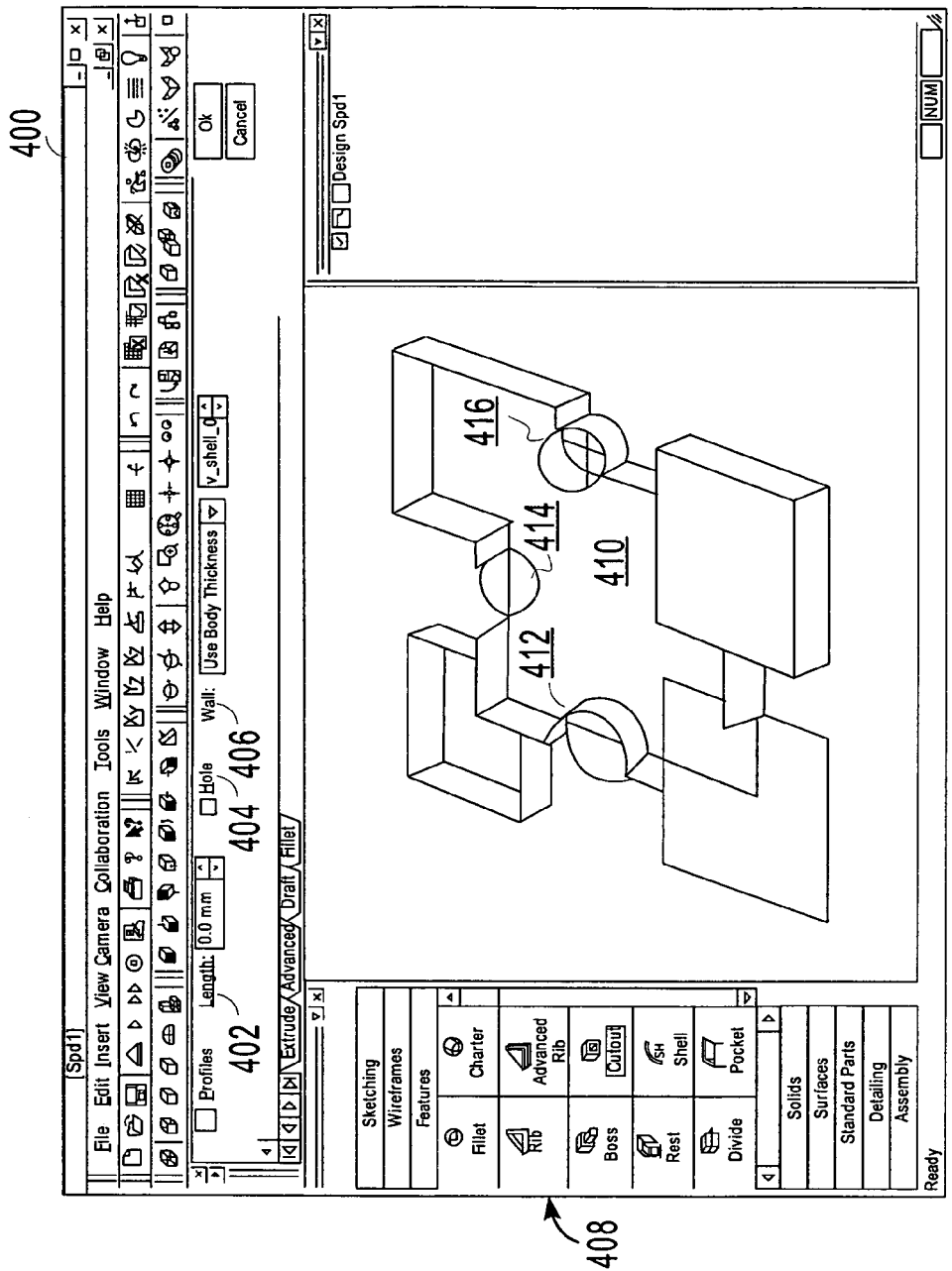

FIGS. 3 and 4 illustrate examples of user interfaces that can be used in one embodiment of the functional modeling process.

Referring to FIG. 3, a user interface 300 displays a set 320 of design features including an extrude feature selected by the user. A set of parameters available for the extrude feature includes a volume type parameter 306, a solidity parameter 304 and a shellability parameter 302. Parameter 308 is a geometric parameter that defines the thickness of the shell.

Design elements 310, 312, 314 and 316 were each added to object 318 using various behavioral parameters associated with the extrusion feature. Design element 310 was created by selecting "solid" for parameter 304, "non-shellable" for parameter 302 and "default" for parameter 306. The "default" volume type represents a volume added outside of the existing body.

Design element 312 was created by selecting "solid" for parameter 304, "shellable" for parameter 302 and "default" for parameter 306. Because the shellable parameter was selected, the cavities of design element 310 and existing design element 318 are integrated together.

Design element 314 was created by selecting "solid" for parameter 304, "non-shellable" for parameter 302 and "add" for parameter 306. The "add" volume type represents a volume added both inside and outside of the existing body.

Design element 316 was created by selecting "solid" for parameter 304, "non-shellable" for parameter 302 and "subtract" for parameter 306. The "subtract" volume type represents a volume subtracted from the existing body.

Referring to FIG. 4, user interface 400 displays a set 408 of design features including a cutout feature selected by the user. A set of parameters available for the cutout feature includes a hole parameter 404 (specifying whether the cutout has a bottom) and a wall thickness parameter 406. Parameter 402 is a geometric parameter that defines the length of the cutout.

Cutouts 412, 414 and 416 were each created using various behavioral parameters associated with the cutout feature. Cutout 412 was created by selecting a "use body thickness" option for parameter 406. As a result, the wall thickness of cutout 412 will be maintained the same as that of the body.

Cutout 414 was created by selecting a "no wall" option for parameter 406. Accordingly, cutout 414 was created without the wall.

Cutout 416 was created by selecting an "enter thickness" option for parameter 406 and specifying a particular size. Because this size is larger than that of the body, the wall of cutout 416 is thicker than the rest of the walls.

Functional Object Representation

Functional object representation (FOR) provides a history-independent approach for creating and maintaining data pertaining to a digital model. The FOR is based on a predefined set of body partitions that compose the body of the object being modeled. Each body partition is associated with a certain volume type. These volume types may include, for example, a volume representing a core of the object, a volume representing a cavity inside the object, a volume added outside of the core, a volume added both inside and outside of the core, a volume representing a clearance area within the object (e.g., a cutout), etc.

Figure 5:
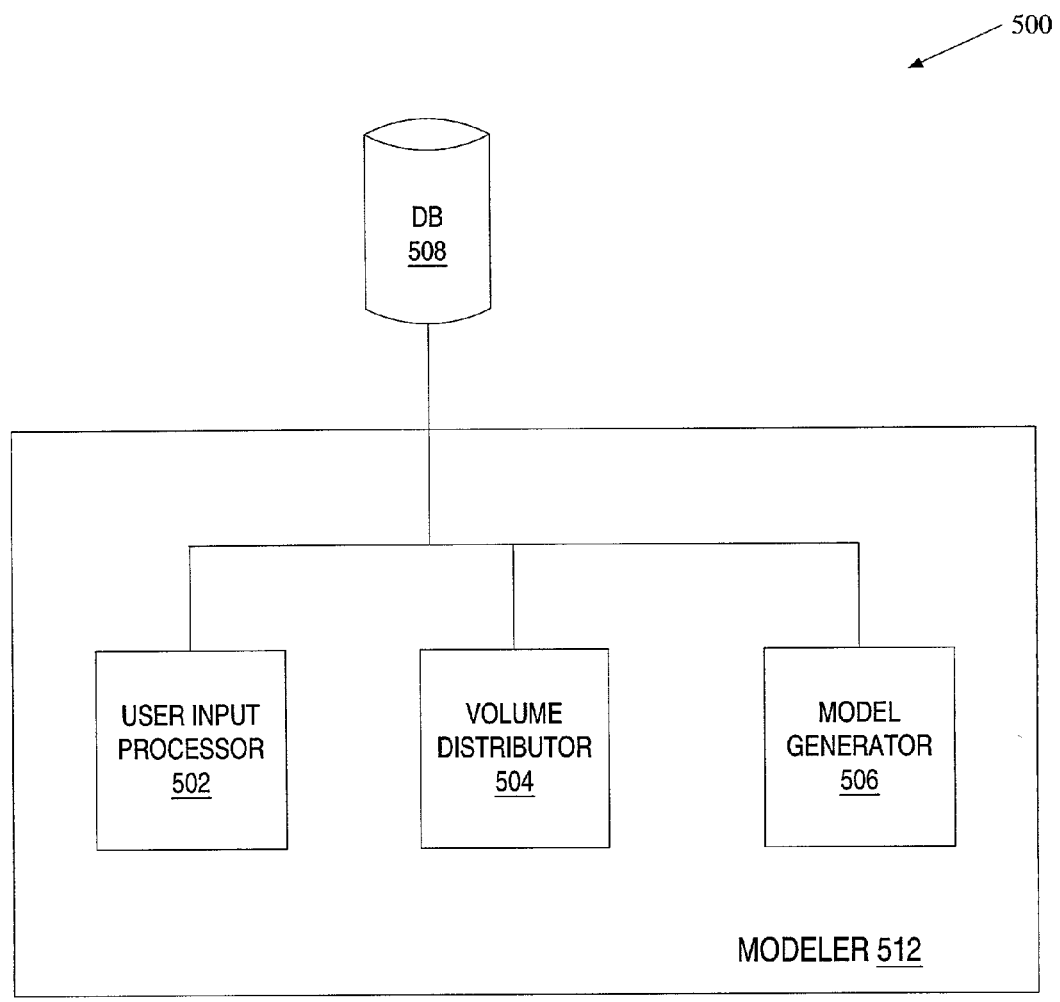
FIG. 5 is a block diagram of one embodiment of a system 500 for designing objects using functional object representation (FOR).

FIG. 5 is a block diagram of one embodiment of a system 500 for designing objects using functional object representation (FOR). Referring to FIG. 5, system 500 includes a modeler 512 and a database 508. In one embodiment, modeler 512 includes a user input processor 502, a volume distributor 504, and a model generator 506.

User input processor 502 is responsible for receiving behavioral parameters selected by the user for each design feature and determining a correspondence between the behavioral parameters and body partitions. In one embodiment, a correspondence between a body partition and one or more behavioral parameters exists if a design feature creates a volume type associated with this body partition.

Volume distributor 504 is responsible for assigning volumes created by each design feature to corresponding body partitions. Depending on the design of the object being modeled, some body partitions may have volumes from one or more design features while others may have no contributing volumes.

Model generator 506 is responsible for computing a digital model of the object using the contributing volumes of each design feature associated with the object. In one embodiment, a constant algorithm is used for the computation. That is, this algorithm may be defined and used for all objects in any industry or, alternatively, for all objects in a specific industry or application. In one embodiment, the algorithm is defined by a static Boolean tree as will be described in greater detail below.

In one embodiment, database 508 stores a predefined set of body partitions with corresponding contributing volumes for each digital model. Each body partition that has a contributing volume may also store a link to a design feature that has created this contributing volume. This link provides access to data pertaining to this design feature, including behavioral and geometrical parameters of the design feature. Data pertaining to design features may also be stored in database 508.

Model generator 506 can re-compute the digital model of the object at any time using the data stored in database 508.

Figure 6:
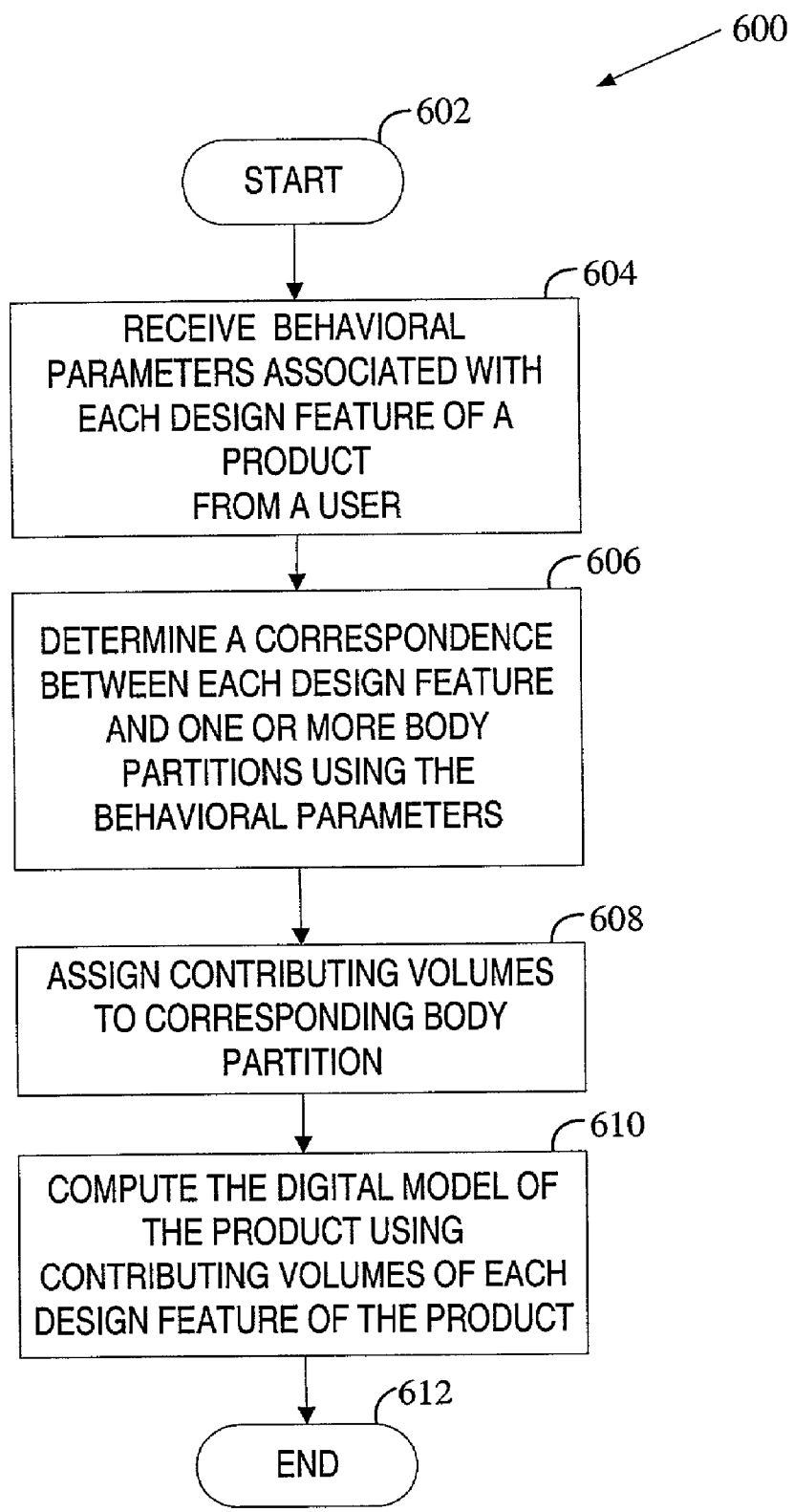
FIG. 6 is a flow diagram of one embodiment of a process for designing objects using functional object representation (FOR).

FIG. 6 is a flow diagram of one embodiment of a process 600 for designing objects using functional object representation (FOR). The process may be performed by processing logic that may comprise hardware (e.g., circuitry, dedicated logic, etc.), software (such as run on a general purpose computer system or a dedicated machine), or a combination of both.

Referring to FIG. 6, process 600 begins with processing logic receiving behavioral parameters associated with each design feature of an object from the user (processing block 604). At processing block 606, processing logic determines a correspondence between each design feature and one or more body partitions using the behavioral parameters. That is, based on its specified behavioral parameters, a design feature may contribute volumes to certain body partitions. Processing logic analyzes the behavioral parameters specified for each design feature and determines which body partitions should receive contributing volumes.

At processing block 608, processing logic assigns contributing volumes to corresponding body partitions. In one embodiment, the predefined set of body partitions and corresponding contributing volumes are stored in the database, together with links to data pertaining to the design features. This data may include a set of behavioral and geometrical parameters associated with each design feature. In one embodiment, the database also stores links between related design features of the object.

Afterwards, at processing block 610, processing logic computes the digital model of the object using contributing volumes of each design feature of the object. Subsequently, the user may request to modify an existing design feature or add a new design feature. Then, processing logic will reassign the contributing volumes according to this change and re-compute the digital model of the object. Accordingly, a designer can implement and change design elements at any stage in the design process, regardless of the order of operation.

Figure 7:
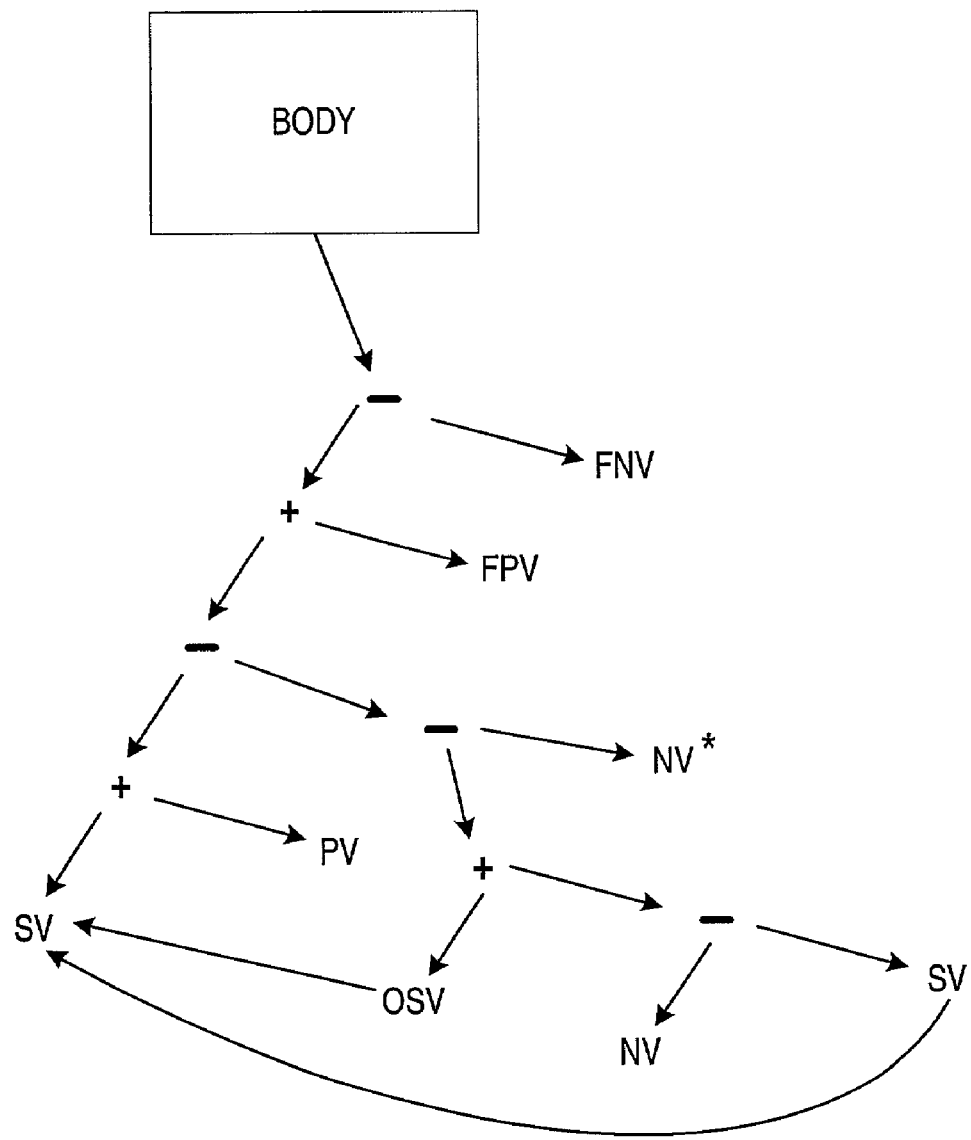
FIG. 7 illustrates one embodiment of a static Boolean tree that can be used to compute a digital model.

FIG. 7 illustrates one embodiment of a static Boolean tree that can be used to compute a digital model. Referring to FIG. 7, a body of an object is presented as a combination of body partitions. Each body partition is associated with a certain volume type. The volume types include shellable volumes (SV), positive volumes (PV), negative volumes (NV), negative volumes subtracted from a cavity within the body (NV*), operational shellable volumes (OSV), functional positive volumes (FPV), and functional negative volumes (FNV).

SV represents the volume of the body core. OSV represents the volume of the body's cavity. PV represents positive volumes added outside of the body. NV represents negative volumes subtracted from volumes located outside of the body. NV* represents negative volumes subtracted from the cavity. FPV represents positive volumes added both inside and outside of the core. FNV represents negative volumes of clearance areas inside and outside of the body.

Figure 8A:
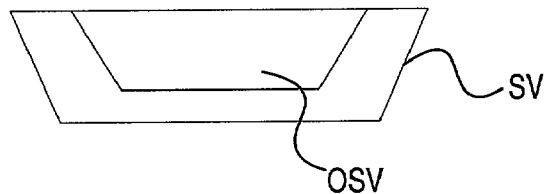
FIGS. 8A–8O illustrate various examples of design features and volume types created by the design features.
Figure 8B:
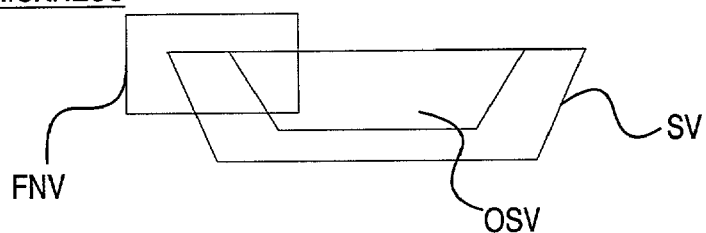
Figure 8C:
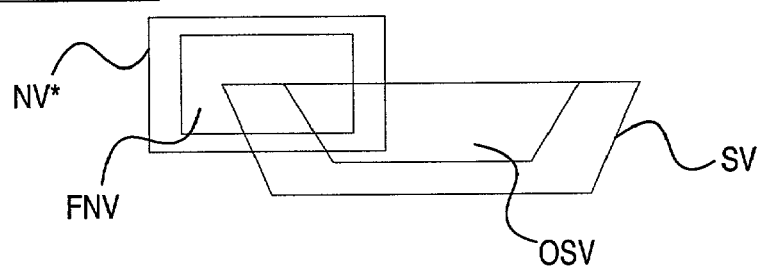
Figure 8D:
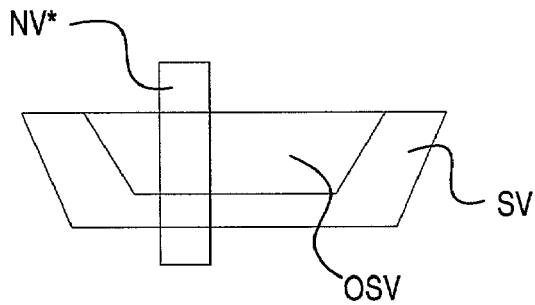
Figure 8E:
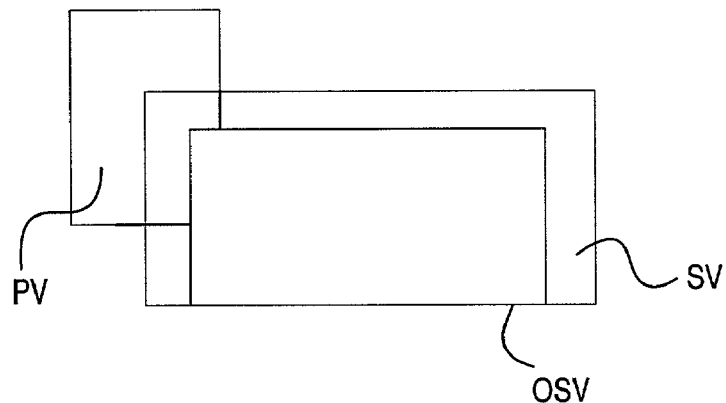
Figure 8F:
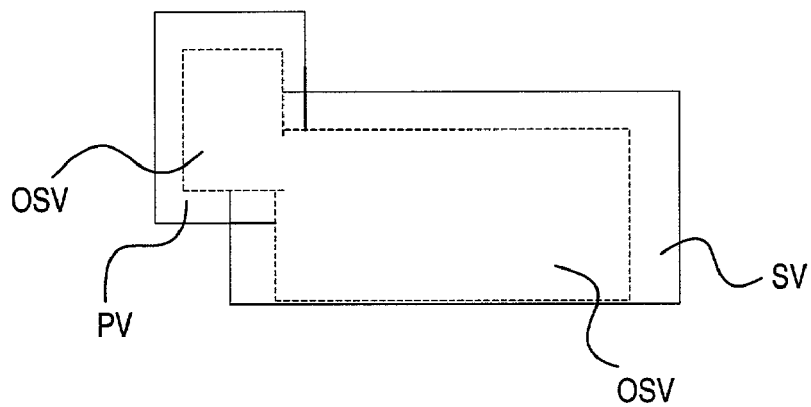
Figure 8G:
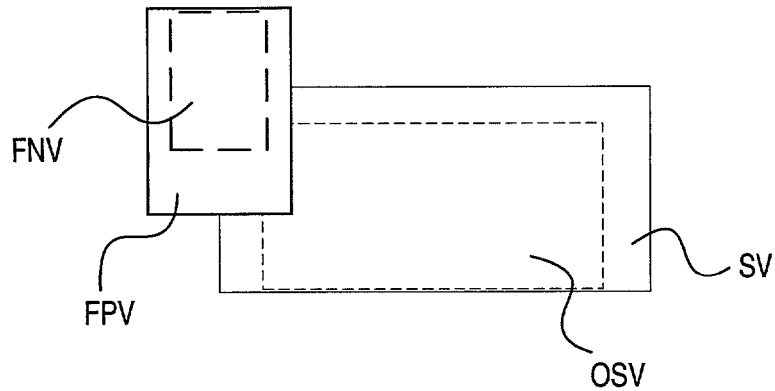
Figure 8H:
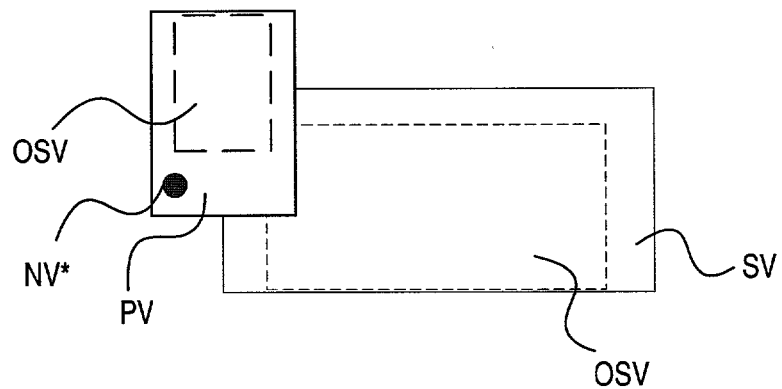
Figure 8I:
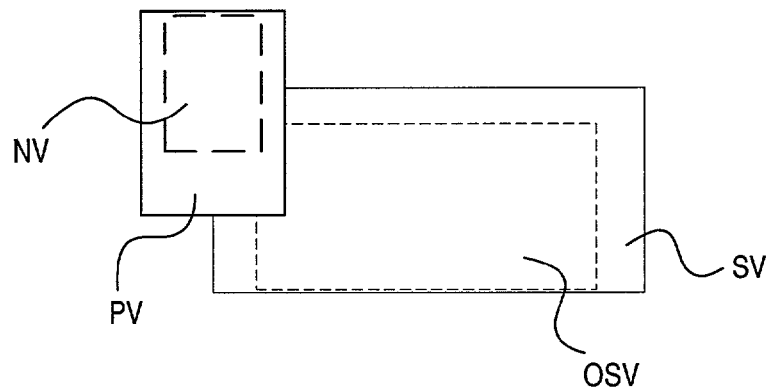
Figure 8J:
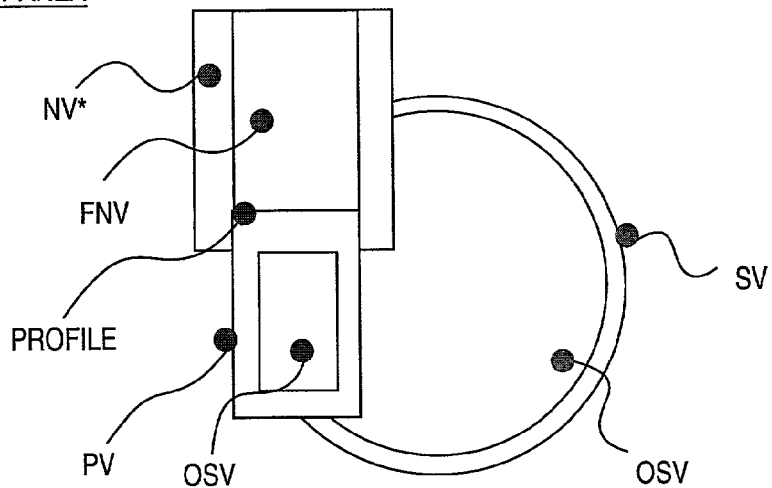
Figure 8K:
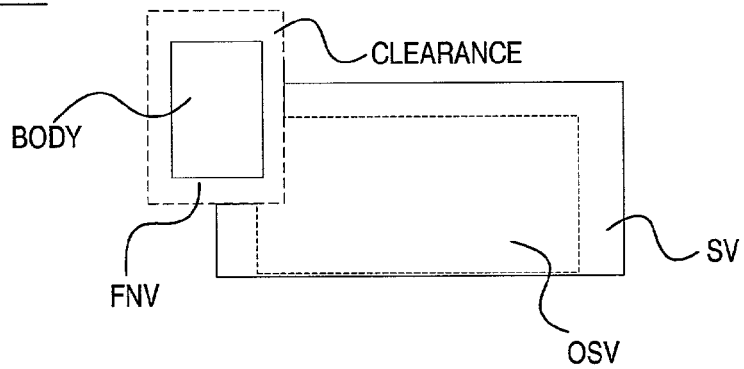
Figure 8L:
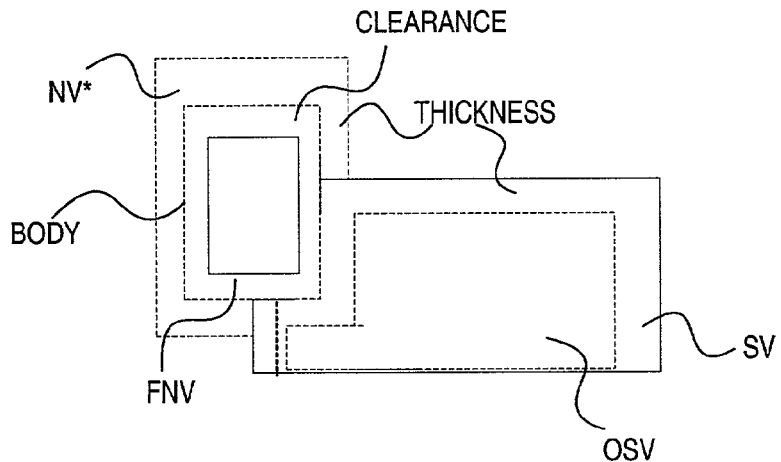
Figure 8M:
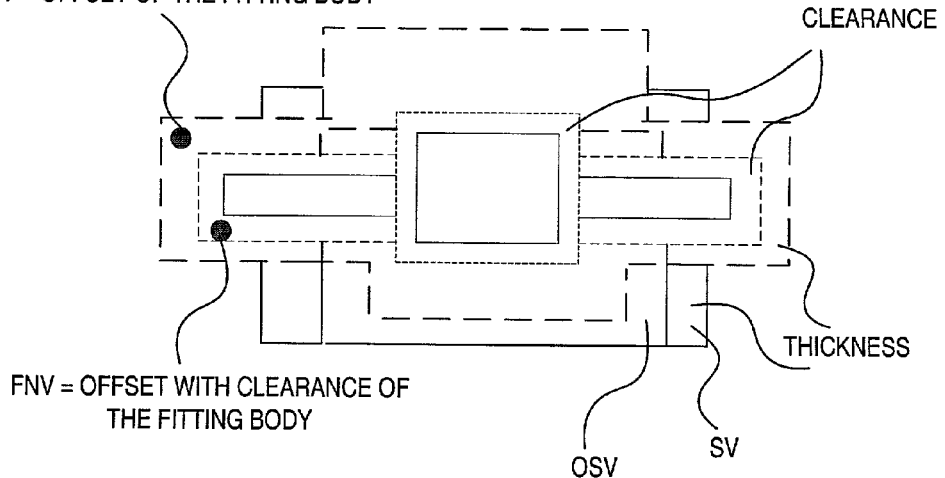
Figure 8N:
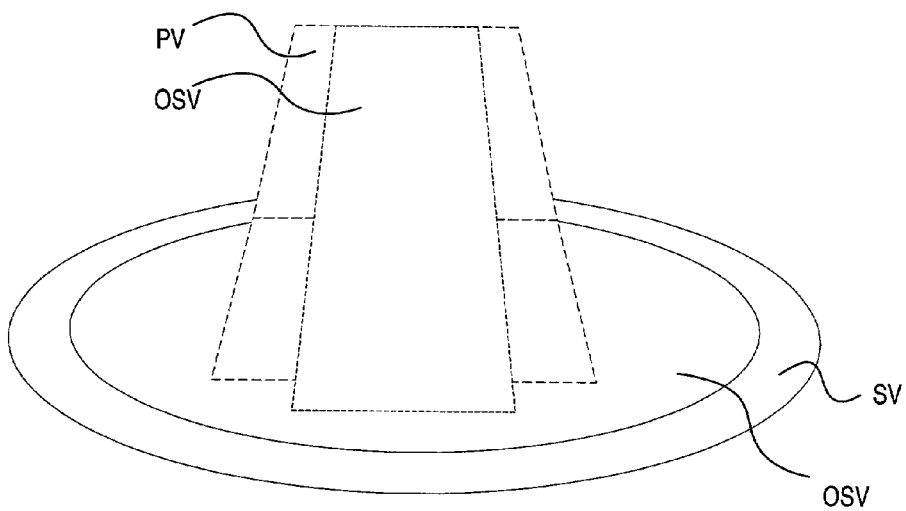
Figure 8O:
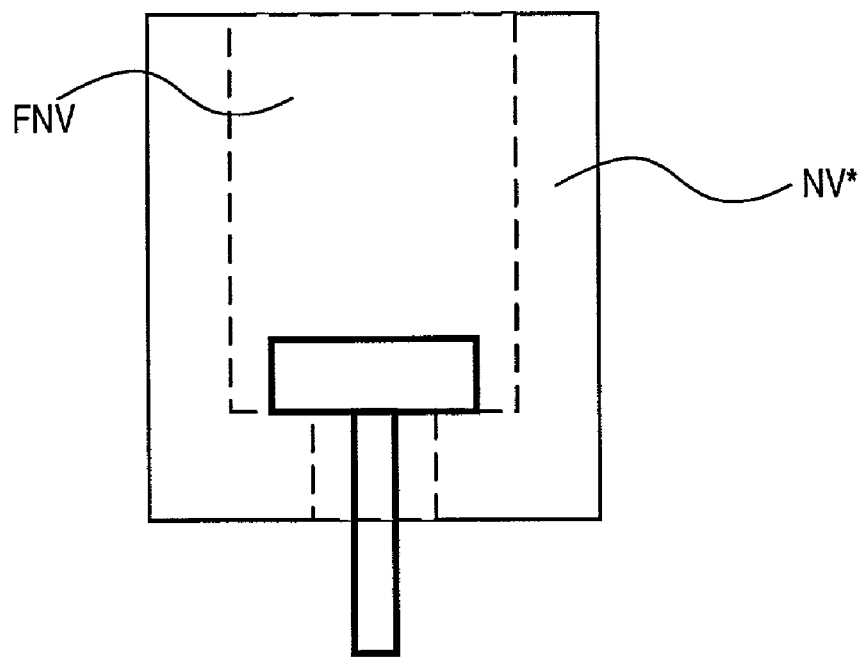
Figure 8O:
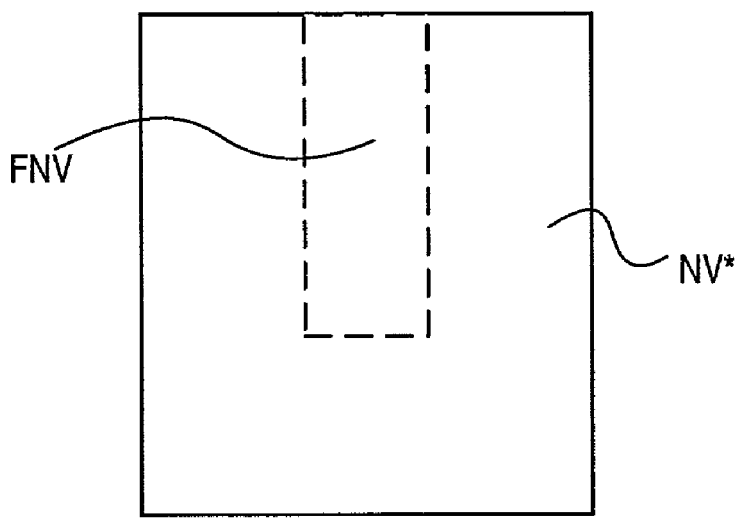

FIGS. 8A–8O illustrate various examples of design features. For each design feature, one or more volume types associated with this feature are identified.

Referring back to FIG. 7, the static Boolean tree defines the following constant algorithm for computing a digital model:

$$\text{Final body} = SV + PV - [OSV + (NV - SV) - NV^*] + FPV - FNV.$$

This algorithm, which may be used for computing a digital model of any object or any object in a specific industry, is history-independent because it makes the order of introduction of the above volumes irrelevant for the resulting digital model.

Figure 9:
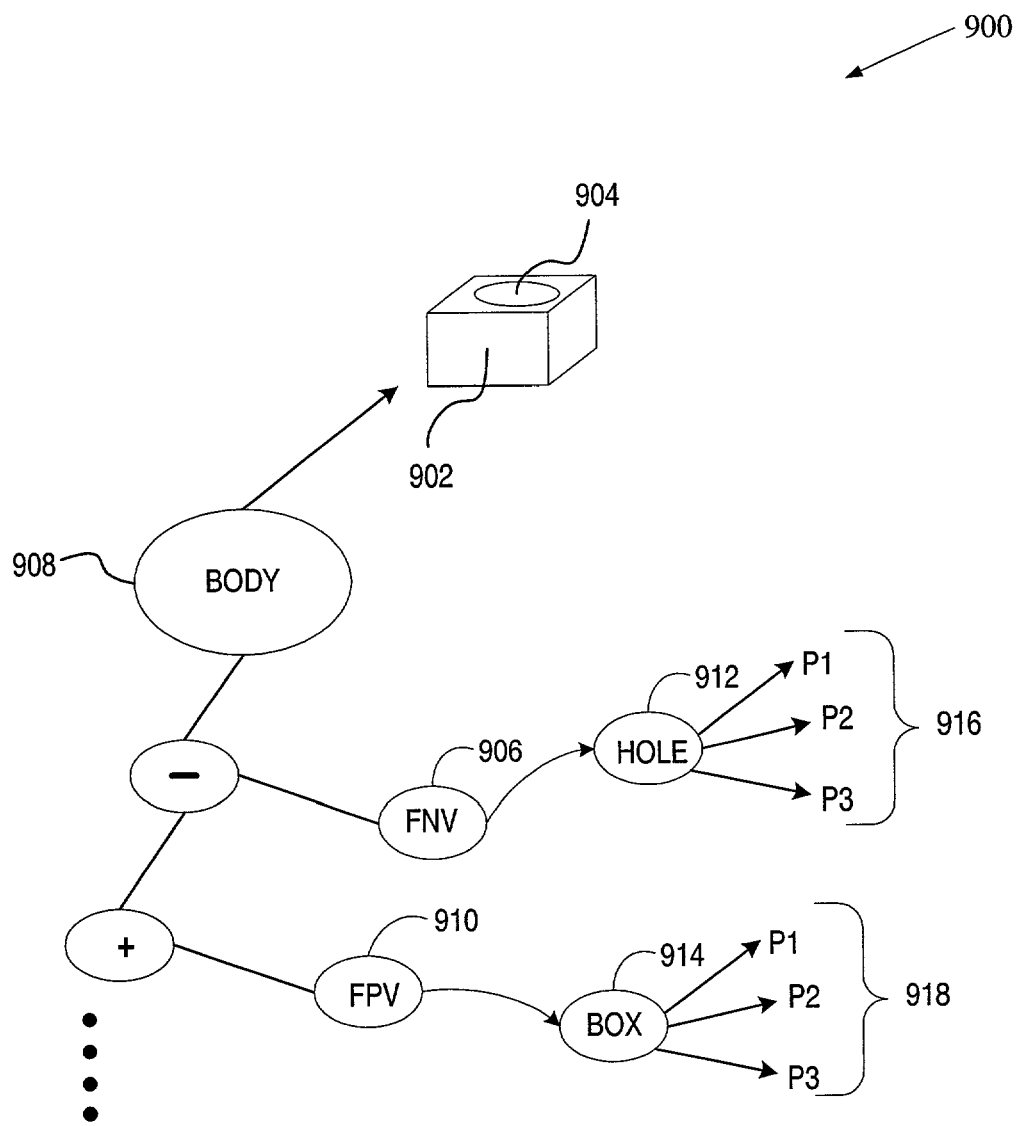
FIG. 9 illustrates one embodiment of a partial process of generating data pertaining to a digital model of an object using a static Boolean tree.

FIG. 9 illustrates one embodiment of a partial process of generating data pertaining to a digital model of an object using a static Boolean tree.

Referring to FIG. 9, body 908 of an object consisting of a box 902 and a hole 904 is created. As shown, box 902 contributes volume to body partition 910 associated with FPV and hole 904 contributes volume to body partition 906 associated with FNV. Body partitions 906 and 910 are linked to data 912 and 914 that identify corresponding design features. Data 912 and 914 are in turn linked to parameters 916 and 918 (behavioral and geometrical) of corresponding design features. Contributing volumes FNV and FPV are calculated using the geometrical parameters of corresponding design features.

In one embodiment (not shown), a product consists of two or more related objects. In this embodiment, the body of one object may be linked to the body of a related object.

The data structure discussed above only requires to capture the functional data of individual design elements, thus providing an efficient way of storing and manipulating a set of data required for generating the digital model. Accordingly, this set of data can be easily transported via a network.

Design Intent Merge

Figure 10:
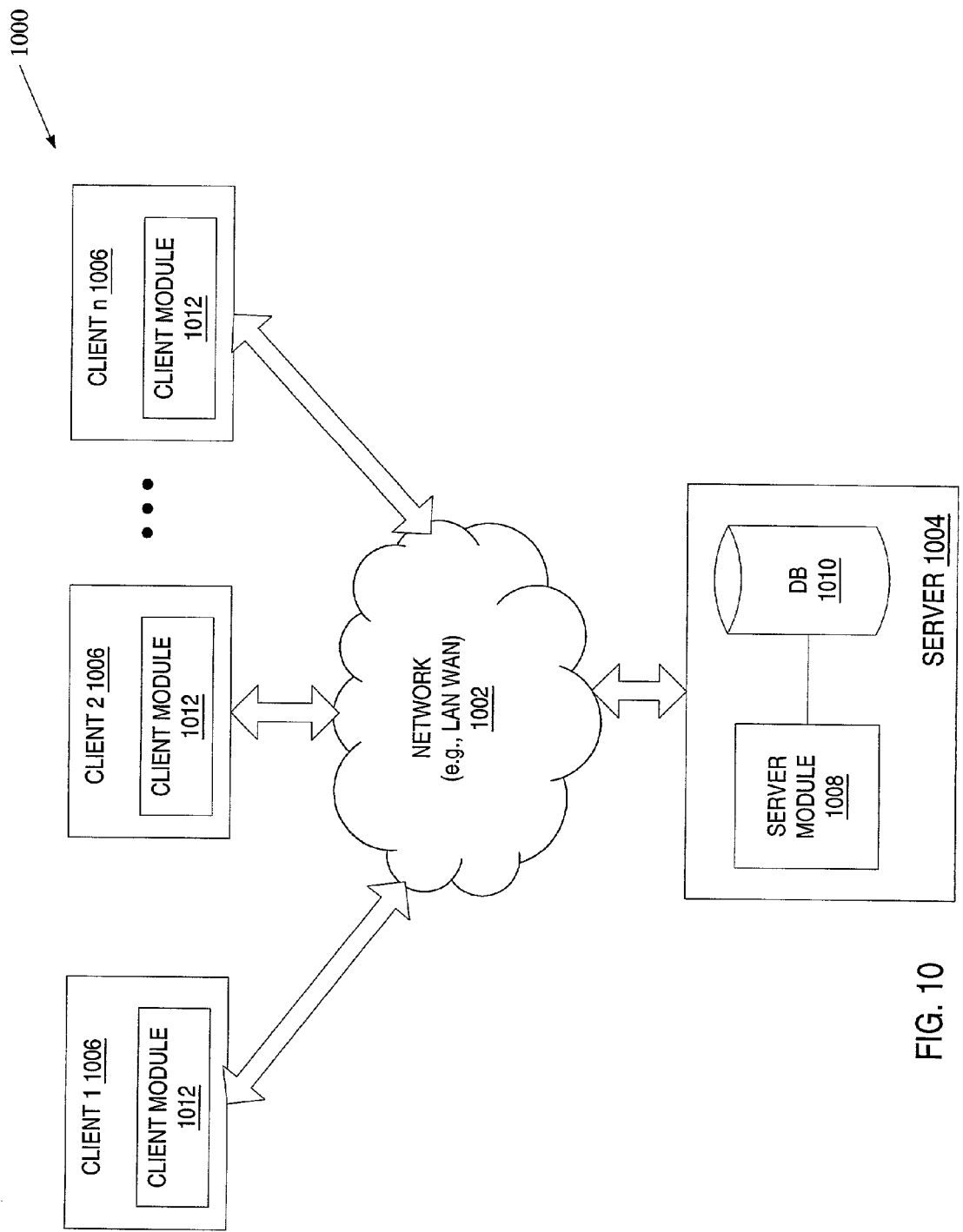
FIG. 10 is block diagram of one embodiment of a network architecture used for design collaboration.

FIG. 10 is a block diagram of one embodiment of network architecture used for design collaboration.

Referring to FIG. 10, clients 1006 represent computers of each participant in simultaneous object development. Each client 1006 is connected to a server 1004 via a network 1002. Network 1002 may be any private network (e.g., LAN) or public network (e.g., Internet, wireless network, etc.).

Each client 1006 includes a client module 1012 which is responsible for packaging data and transmitting it to server 1004 in response to a request of a participant to share his or her modification of the digital model with other participants of simultaneous product development.

Server 1004 includes a server module 1008 which operates like a directory service, receiving data from one or more clients 1006 and sending, when directed, the data to other clients 1006 for a merge with other participants' data.

Server 1004 also includes a database 1010 which stores data pertaining to digital models created by users of clients 1006. In one embodiment, database 1010 stores data pertaining to different versions of the digital model, showing each participant's contribution into design features and associations between design features. In one embodiment, database 101 also maintains a persistent identity of each modification by storing information identifying the location and the time of each modification.

Participants can work in a synchronous mode, i.e., work together in real time, constantly sharing and merging their modeling operations. Alternatively, the participants can work in an asynchronous mode, i.e., work on their own tasks offline, and share, receive and merge modeling operations whenever they choose to go online.

Figure 11:
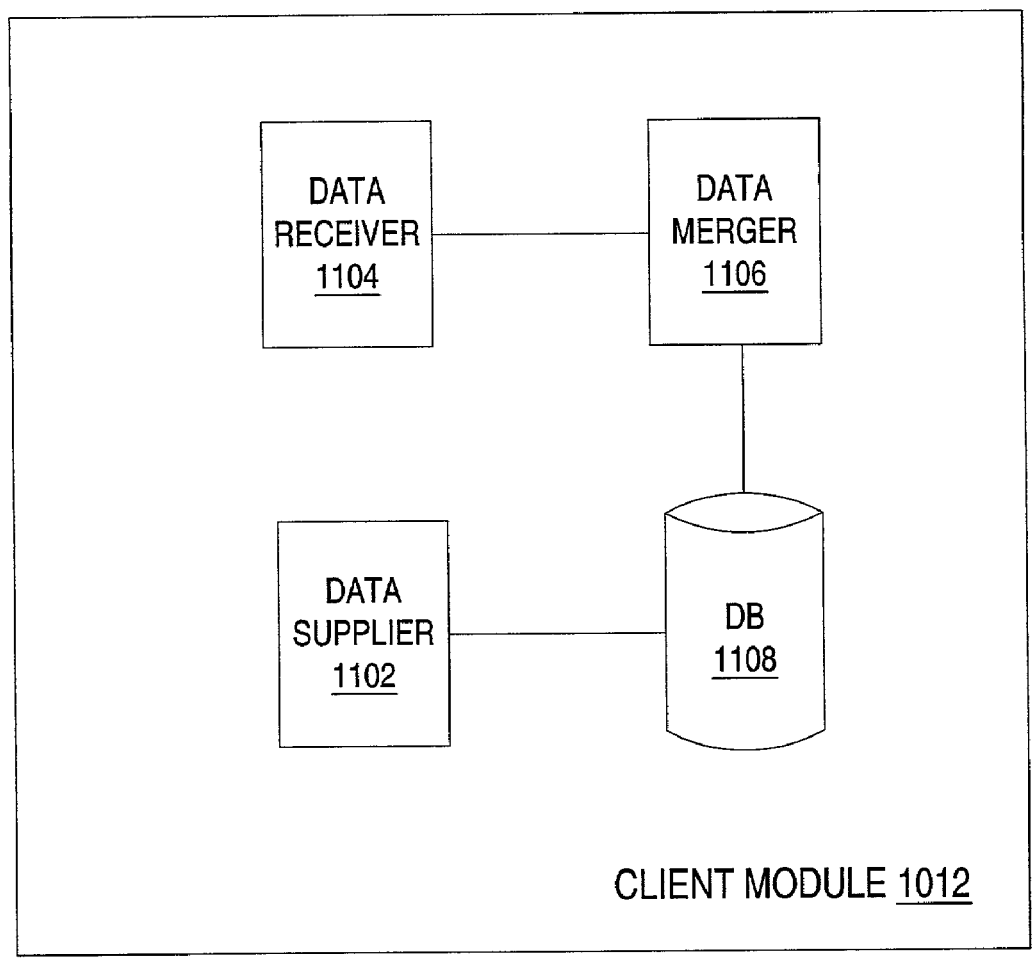
FIG. 11 is a block diagram of one embodiment of a client module 1012 of FIG. 10.

FIG. 11 is a block diagram of one embodiment of a client module 1012 of FIG. 10. Referring to FIG. 11, client module 1012 includes a data receiver 1104, a data merger 1106, a data supplier 1102, and a database 1108.

Data supplier 1102 is responsible for processing a participant's request to share a change he or she made to a digital model with another participant or participants. In one embodiment, data supplier 1102, upon receiving the participant's request, extracts data pertaining to the change from database 1108 and sends the extracted data to server 1004, with information identifying a recipient participant(s). In one embodiment, data supplier 1102 automatically extracts all data related to a modified design feature.

In one embodiment, the participant may request to protect the design feature being sent from other participants' changes to this design feature. Data supplier 1102 includes information reflecting this limitation in the packet sent to the server. In one embodiment, the participant is also provided with an option to send all recent changes (i.e., the changes made after the last transmission), rather than a specific change to the recipients. Data supplier 1102 determines what changes have been made since the last transmission, extracts data pertaining to these changes and sends it to server 1004.

Figure 12:
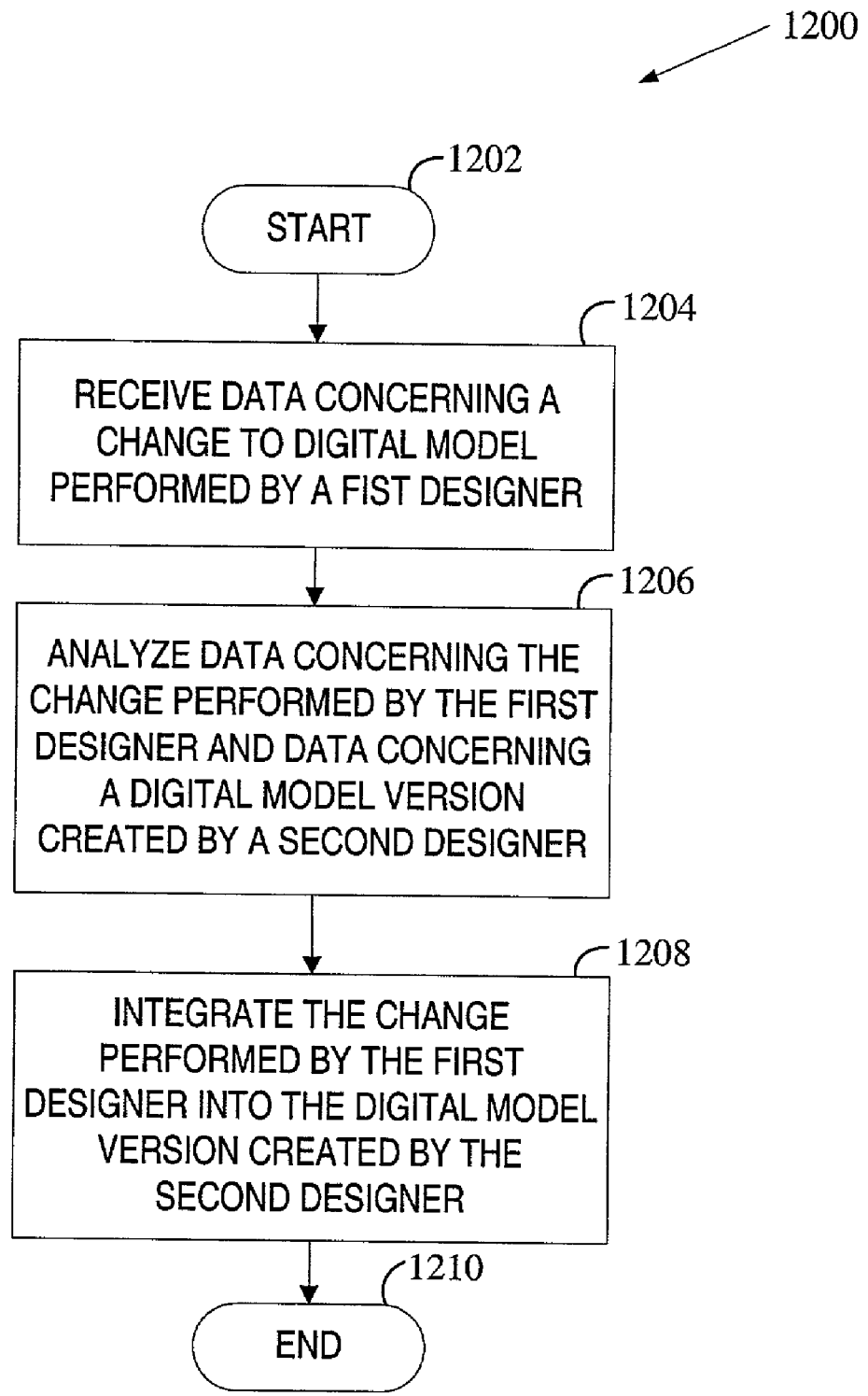
FIG. 12 is a flow diagram of one embodiment of a process for designing objects using design intent merge.

Data receiver 1104 is responsible for receiving changes made by other participants. Data merger 1106 is responsible for analyzing data received from other participants and data pertaining to the version created by this participant, and based on this analysis, integrating the changes performed by the other participants into the version created by this participant. For example, data merger 1106 may receive an identifier of a modified design feature, contributing volumes created by the modified design feature and geometric parameters of the modified design feature. Data merger 1106 then retrieves corresponding data from database 1108 using the design feature's identifier, compares the contributing volumes and geometric parameters of the modified design feature with corresponding data stored in database 1108, and updates database 1108 with the received information. FIG. 12 is a flow diagram of one embodiment of a process 1200 for designing objects using design intent merge. The process may be performed by processing logic that may comprise hardware (e.g., circuitry, dedicated logic, etc.), software (such as run on a general purpose computer system or a dedicated machine), or a combination of both.

Referring to FIG. 12, process 1200 begins with processing logic receiving data concerning a change made by a first participant over a network (processing block 1204). At processing block 1206, processing logic analyzes the data concerning the change made by the first participant and data concerning a digital model version created by a second participant. At processing block 1208, processing logic integrates the change performed by the first participant into the digital model version created by the second participant based on the analysis performed at processing block 1206, as described in more detail above.

In one embodiment, processing logic subsequently receives a request from the second participant to inform the first participant about the change made by the second participant. In response to this request, processing logic extracts data concerning the change and sends the extracted data to a server that stores it and forwards it to the first participant.

An Exemplary Computer System

Figure 13:
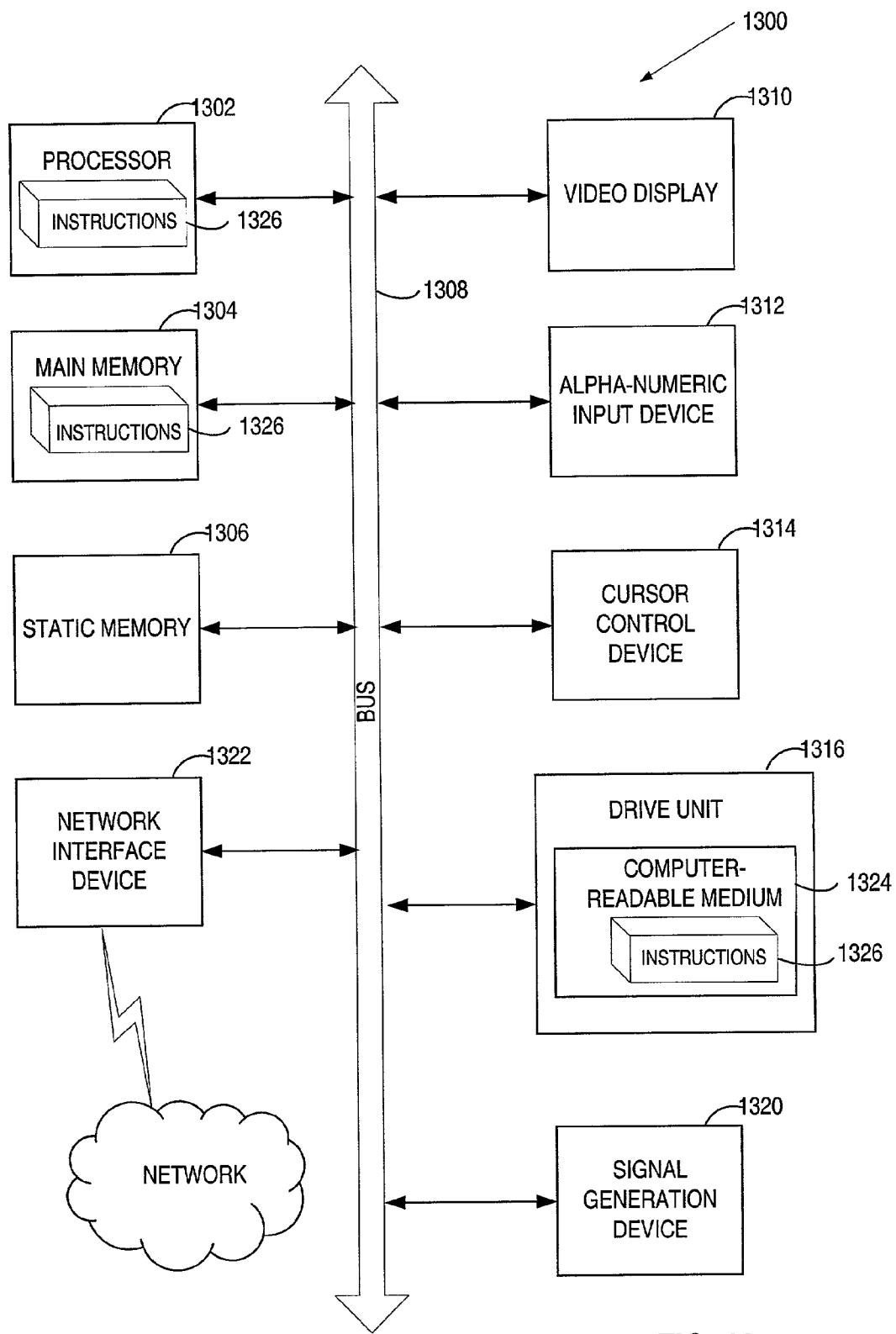
FIG. 13 is a block diagram of an exemplary computer system.

FIG. 13 is a block diagram of an exemplary computer system 1300 that may be used to perform one or more of the operations described herein. In alternative embodiments, the machine may comprise a network router, a network switch, a network bridge, Personal Digital Assistant (PDA), a cellular telephone, a web appliance or any machine capable of executing a sequence of instructions that specify actions to be taken by that machine.

The computer system 1300 includes a processor 1302, a main memory 1304 and a static memory 1306, which communicate with each other via a bus 1308. The computer system 1300 may further include a video display unit 1310 (e.g., a liquid crystal display (LCD) or a cathode ray tube (CRT)). The computer system 1300 also includes an alphanumeric input device 1312 (e.g., a keyboard), a cursor control device 1314 (e.g., a mouse), a disk drive unit 1316, a signal generation device 1320 (e.g., a speaker) and a network interface device 1322.

The disk drive unit 1316 includes a computer-readable medium 1324 on which is stored a set of instructions (i.e., software) 1326 embodying any one, or all, of the methodologies described above. The software 1326 is also shown to reside, completely or at least partially, within the main memory 1304 and/or within the processor 1302. The software 1326 may further be transmitted or received via the network interface device 1322. For the purposes of this specification, the term "computer-readable medium" shall be taken to include any medium that is capable of storing or encoding a sequence of instructions for execution by the computer and that cause the computer to perform any one of the methodologies of the present invention. The term "computer-readable medium" shall accordingly be taken to included, but not be limited to, solid-state memories, optical and magnetic disks, and carrier wave signals.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for merging design intent of multiple designers with respect to a digital model of an object, the method comprising:
   receiving data concerning a change to a design feature of the digital model over a network, the data concerning the change comprising parameters of the design feature modified by a fist designer;
   analyzing the data concerning the change performed by the first designer and data concerning a digital model version created by a second designer, the analyzing comprising identifying differences between the parameters of the design feature modified by the first designer and parameters of a design feature of the digital model version created by the second designer; and
   integrating the change performed by the first designer into the digital model version created by the second designer based on the analyzing.

2. The method of claim 1 wherein the data concerning the change performed by the first designer includes an identifier of the design feature modified by the first designer.

3. The method of claim 1 wherein the parameters of the design feature includes one or more behavioral parameters of the design feature.

4. The method of claim 1 wherein the data concerning the change performed by the first designer further includes a functional object representation of a digital model version created by the first designer.

5. The method of claim 1 wherein the data concerning the digital model version created by the second designer includes a functional object representation (FOR) of the digital model version.

6. The method of claim 5 wherein the FOR includes a predefined set of body partitions with corresponding contributing volumes and links to design features of the digital model.

7. The method of claim 6 further comprising:
   maintaining a database storing the FOR of the digital model and data characterizing each design feature of the digital model.

8. The method of claim 7 wherein the data characterizing each design feature includes information uniquely identifying said each design feature by the time and location associated with creation of said each design feature.

9. The method of claim 7 wherein the data characterizing each design feature includes information identifying one or more designers who contributed in the design of said each design feature.

10. The method of claim 7 wherein the data characterizing each design feature includes information identifying one or more designers who defined associations between said each design feature and any other design feature of the digital model.

11. The method of claim 1 further comprising:
    receiving a request of the second designer to inform the first designer about a change performed by the second designer with respect to the digital model;
    extracting data concerning the change performed by the second designer; and
    sending the extracted data with an identifier of a destination client device to a server over the network, the destination client device being used by the first designer.

12. The method of claim 11 wherein the request specifies which design feature was modified.

13. The method of claim 11 wherein the request asks for all changes to the digital model that occurred between the time of the request and the time of a last transmission of changes to the destination device.

14. The method of claim 11 wherein the request does not permit the first designer to modify any design element sent by the second designer.

15. The method of claim 11 wherein each change to the digital model is communicated between the first designer and the second designer as soon as said change is performed.

16. The method of claim 11 wherein changes to the digital model are communicated between the first designer and the second designer asynchronously.

17. An apparatus for merging design intent of multiple designers with respect to a digital model of an object, the apparatus comprising:
    a data receiver to receive data concerning a change to a design feature of the digital model over a network, the data concerning the change comprising parameters of the design feature modified by a first designer; and
    a data merger to analyze the data concerning the change performed by the first designer and data concerning a digital model version created by a second designer, the analyzing comprising identifying differences between the parameters of the design feature modified by the first designer and parameters of a design feature of the digital model version created by the second designer, the data merger further to integrate the change performed by the first designer into the digital model version created by the second designer based on the analyzing.

18. The apparatus of claim 17 wherein the data concerning the change performed by the first designer includes an identifier of the design feature modified by the first designer.

19. The apparatus of claim 17 wherein the parameters of the design feature includes one or more behavioral parameters of the design feature.

20. The apparatus of claim 17 wherein the data concerning the change performed by the first designer further includes a functional object representation of a digital model version created by the first designer.

21. The apparatus of claim 17 wherein the data concerning the digital model version created by the second designer includes a functional object representation (FOR) of the digital model version.

22. The apparatus of claim 21 wherein the FOR includes a predefined set of body partitions with corresponding contributing volumes and links to design features of the digital model.

23. The apparatus of claim 22 further comprising a database to store the FOR of the digital model and data characterizing each design feature of the digital model.

24. The apparatus of claim 23 wherein the data characterizing each design feature includes information uniquely identifying said each design feature by the time and location associated with creation of said each design feature.

25. The apparatus of claim 23 wherein the data characterizing each design feature includes information identifying one or more designers who contributed in the design of said each design feature.

26. The apparatus of claim 23 wherein the data characterizing each design feature includes information identifying one or more designers who defined associations between said each design feature and any other design feature of the digital model.

27. The apparatus of claim 17 further comprising:
a data supplier to receive a request of the second designer to inform the first designer about a change performed by the second designer with respect to the digital model, to extract data concerning the change performed by the second designer, and to send the extracted data with an identifier of a destination client device to a server over the network, the destination client device being used by the first designer.

28. The apparatus of claim 27 wherein the request specifies which design feature was modified.

29. The apparatus of claim 27 wherein the request asks for all changes to the digital model that occurred between the time of the request and the time of a last transmission of changes to the destination device.

30. The apparatus of claim 27 wherein the request does not permit the first designer to modify any design element sent by the second designer.

31. The apparatus of claim 27 wherein each change to the digital model is communicated between the first designer and the second designer as soon as said change is performed.

32. The apparatus of claim 27 wherein changes to the digital model are communicated between the first designer and the second designer asynchronously.

33. A system for merging design intent of multiple designers with respect to a digital model of an object, the system comprising:
means for receiving data concerning a change to a design feature of the digital model over a network, the data concerning the change comprising parameters of the design feature modified by a first designer;
means for analyzing the data concerning the change performed by the first designer and data concerning a digital model version created by a second designer, the means for analyzing comprising means for identifying differences between the parameters of the design feature modified by the first designer and parameters of a design feature of the digital model version created by the second designer; and
means for integrating the change performed by the first designer into the digital model version created by the second designer based on the analyzing.

34. A computer readable medium comprising executable instructions which when executed on a processing system cause said processing system to perform a method comprising:
receiving data concerning a change to a design feature of the digital model over a network, the data concerning the change comprising parameters of the design feature modified by a first designer;
analyzing the data concerning the change performed by the first designer and data concerning a digital model version created by a second designer, the analyzing comprising identifying differences between the parameters of the design feature modified by the first designer and parameters of a design feature of the digital model version created by the second designer; and
integrating the change performed by the first designer into the digital model version created by the second designer based on the analyzing.

* * * * *